United States Patent [19]

Neukomm

[11] Patent Number: 4,586,065
[45] Date of Patent: Apr. 29, 1986

[54] MNOS MEMORY CELL WITHOUT SIDEWALK

[75] Inventor: Hans R. Neukomm, Thalwil, Switzerland

[73] Assignee: U.S. Philips Corporation, New York, N.Y.

[21] Appl. No.: 464,456

[22] Filed: Feb. 7, 1983

[30] Foreign Application Priority Data

Feb. 25, 1982 [NL] Netherlands ............... 8200756

[51] Int. Cl.[4] .................. H01L 29/78; G11C 11/40
[52] U.S. Cl. ..................................... 357/23.5; 357/41; 357/54; 365/184; 307/303
[58] Field of Search ............ 357/23.5 NT, 54, 41; 365/184; 307/303

[56] References Cited

U.S. PATENT DOCUMENTS

| | | | |
|---|---|---|---|
| 4,096,509 | 6/1978 | Blaha et al. | 357/41 |
| 4,249,191 | 2/1981 | Hsia | 357/23.5 |
| 4,305,086 | 12/1981 | Khajezadeh | 357/54 |
| 4,353,083 | 10/1982 | Trudel et al. | 357/54 |
| 4,454,524 | 6/1984 | Spence | 357/23.5 |
| 4,467,452 | 8/1984 | Saito et al. | 357/23.5 |

OTHER PUBLICATIONS

Chang, "Nonvolatile Semiconductor Memory Devices," Proceedings of the IEEE, vol. 64, No. 7, Jul. 1976.

*Primary Examiner*—Andrew J. James
*Assistant Examiner*—E. Fallick
*Attorney, Agent, or Firm*—Robert T. Mayer; Steven R. Biren

[57] ABSTRACT

A non-volatile memory cell of the MNOS type, in which the sidewalk effect is avoided or at least considerably reduced by limiting the extension of the boundary layer, in which charge is stored, to a region which is smaller than the thin gate dielectric covered by the gate electrode. The gate electrode extends from the active region over a thin insulator, in which no charge storage takes place, to above the thicker field insulation.

8 Claims, 25 Drawing Figures

MNOS MEMORY CELL WITHOUT SIDEWALK

BACKGROUND OF THE INVENTION

The invention relates to a semiconductor device comprising a semiconductor body having at least a storage site with an insulated gate electrode, the semiconductor body having a surface contiguous to at least an electrode region which serves as electrode and forms a rectifying junction with a semiconductor region of a first conductivity type common to the electrode region and the storage site, the electrode region, viewed on the surface, being contiguous to an active semiconductor region which has a boundary which is defined for a given part by the adjoining electrode region and for at least a further part by a thick insulating layer serving as field insulation, a thin insulating layer being present on the active region. Said thin insulating layer comprising at least a first and a second sublayer, the second sublayer being separated by the first sublayer from the active region and a boundary layer being present at and/or near the interface between the first and the second sublayer, in which boundary layer charge can be stored which determines the information content of the storage site, while a gate electrode isolated from the active region extends over the sublayers, which gate electrode is extended at the further part of the boundary of the active region defined by the field insulation to above the field insulation.

Such a semiconductor device is known from "Proceedings of the I.E.E.E.", Vol. 64, No. 7, July 1976, p. 1039-1059. The storage site forms part of a memory field effect transistor, the active region being situated between a source and a drain electrode region. In this publication, one of the problems which may occur in such memory transistors is described as "Sidewalk Effect" on p. 1047. Between the thick field insulation and the thin insulating layer there is present a transition region in which the thickness of the insulating material increases gradually. Repeated writing and erasing in the memory transistor will result in that stored charge will gradually also accumulate in the boundary layer underneath the gate electrode in the transition region. Consequently, the threshold voltage in the transition region will vary. The value of this threshold voltage will lie between the high and the low threshold voltage of the memory transistor proper. Reading of the storage condition of the memory transistor may now give rise to problems due to the fact that in the condition with high threshold voltage, in which the memory transistor proper is not conducting when it is read out, passage of current under the transition region nevertheless becomes possible. This problems can be solved by providing under the transition regions in the semiconductor body more highly doped surface regions of a conductivity type opposite to that of the source and drain electrode regions of the memory transistor. The doping concentration in these surface regions is chosen so that the threshold voltage in situ is already sufficiently high to prevent a passage of current under the transition regions.

The solution described may give rise to difficulties in practice. As is known, writing and erasing in memory transistors of the kind described requires comparatively high voltages. These voltages may amount to 25 or 30 and sometimes 35 volts. Consequently, comparatively high requirements are imposed on the breakdown voltages of the rectifying junctions between the source and drain electrode regions and the common semiconductor region. The use of more highly doped surface regions under the transition regions may readily lead to comparatively low breakdown voltages if the distance between these surface regions and the source and drain electrode regions are not kept sufficiently large. The distance required leads to memory transistors having a comparatively large channel length which could be reduced only with a corresponding reduction of the breakdown voltage.

SUMMARY OF THE INVENTION

The invention has for its object to provide another solution for the problem of the transition regions, which substantially does not give rise to reduced breakdown voltages and can be used also in memory transistors having comparatively short channel lengths.

A semiconductor device of the kind described above according to the invention is characterized in that the boundary layer for charge storage has an extension which is limited to a region which is smaller than the active region and is located at a certain distance from the further part of the boundary of the active region defined by the field insulation, the gate electrode extending between this further part of the boundary and the region occupied by the boundary layer over a part of the thin insulating layer in which no boundary layer for charge storage is present.

When using the invention, the boundary layer for charge storage no longer extends into the transition regions, as a result of which the threshold voltage in the transition regions substantially does not vary during writing and erasing of the storage site. By inter alia a suitable choice of the thickness of the part of the thin insulation layer which is located under the gate electrode and in which no boundary layer for charge storage is present, the threshold voltage in these parts of the storage site can be fixed at a value which is higher than the voltage applied to the gate electrode when reading the storage site. During reading, solely the condition in the storage part determines whether a conductive layer of a second conductivity type opposite to the first conductivity type is present under the gate electrode or not. The edge portions of the storage site are always nonconducting during reading.

The storage site preferably forms part of a memory transistor having at least a source electrode region and a drain electrode region, the active semiconductor region being situated between these source and drain electrode regions, and the thin insulating layer which comprises the first and the second sublayer constitutes a gate dielectric for the memory transistor.

If the storage site is constructed so that, depending upon the information content, two different conditions can occur, in one of which the threshold voltage (the voltage at which under the gate electrode in the storage site a conductive layer of the second conductivity type opposite to the first conductivity type is just not yet present) is positive, while in the other condition this threshold voltage is negative, the information content can be read advantageously at a voltage of substantially zero volt at the gate electrode. Thus, the period of time is reduced, in which in the operating condition, potential differences occur at the storage site which possibly might influence the information content.

Advantageously, the threshold voltage at the area of the part of the thin insulating layer which is located under the gate electrode and in which no boundary layer for charge storage is present, has a value at which at this area an inversion layer of the second conductivity type can be produced only with the aid of a voltage to be applied to the gate electrode. This part of the storage site or of the memory transistor is then of the enhancement type. At a (reading) voltage of 0 V at the gate electrode, no conductive layer of the second conductivity type will be present in this part of the storage site.

With the use of the present invention, satisfactory results were achieved with structures in which the part of the thin insulating layer which is located under the gate electrode and in which no boundary layer for charge storage is present, had a thickness exceeding that of the part of the thin insulating layer comprising the first and the second sublayer and the boundary layer for charge storage. However, the thickness differences in the part of the thin insulating layer located under the gate electrode are preferably kept considerably smaller than the thickness difference between the thin and thick insulating layer. In this connection, in an important preferred embodiment of the semiconductor device according to the invention, the thickness of the part of the thin insulating layer which is located under the gate electrode and in which no boundary layer for charge storage is present, is at least a factor 10 and preferably a factor 20 or more smaller than the thickness of the adjoining part of the thick insulating layer serving as field insulation.

In another important embodiment of the semiconductor device according to the invention, the said gate electrode constitutes a first gate electrode, while at least a second insulated gate electrode extends above the active semiconductor region and over the thin insulating layer, no boundary layer for charge storage being present in the thin insulating layer under the second gate electrode, the second gate electrode, viewed on the surface, being situated between the first gate electrode and the electrode region and the thickness of the thin insulating layer under the second gate electrode being practically equal to the thickness of the part of the thin insulating layer which is located under the first gate electrode and in which no boundary layer for charge storage is present.

The first and the second gate electrode are insulating from each other and may be located directly beside each other, in which event they may slightly overlap each other; alternatively, they may be located at a certain distance from each other, in which event a further electrode region is situated in the active semiconductor region between these two gate electrodes.

The invention further relates to a method of manufacturing the semiconductor device described. According to the invention, this method is characterized in that a semiconductor body, at a surface of which a thick insulating layer is present having a pattern corresponding to the pattern of the field insulation of the semiconductor device to be manufactured, which pattern leaves free parts of the surface destined for providing circuit elements, in order to obtain a dielectric for one or more storage sites, is provided with a first thin insulating layer which is suitable for obtaining a boundary layer for charge storage, this first thin insulating layer having a pattern such that at the area of the storage sites to be provided this layer is present on exposed parts of the surface and has at least two opposite edges along which the first thin insulating layer extends at a certain distance from the thick insulating layer, and that then the remaining part of the said parts of the surface destined for providing circuit elements, which is not covered by the first insulating layer, is covered with a second thin insulating layer, and that gate electrodes of a suitable material are provided, which partly cover the first and the second thin insulating layer as well as the thick insulating layer, and that the part of the first thin insulating layer not covered by gate electrodes is removed, the remaining part of the first thin insulating layer present on the parts of the surface destined for providing circuit elements being located along its whole periphery at a certain distance from the thick insulating layer.

BRIEF DESCRIPTION OF THE DRAWING

Embodiments of the invention will now be described, by way of example, with reference to the accompanying drawing, in which:

FIGS. 9 to 12 inclusive diagrammatically show cross-sectional view, of the second example; while

DESCRIPTION OF THE PREFERRED EMBODIMENTS

Figure 1:
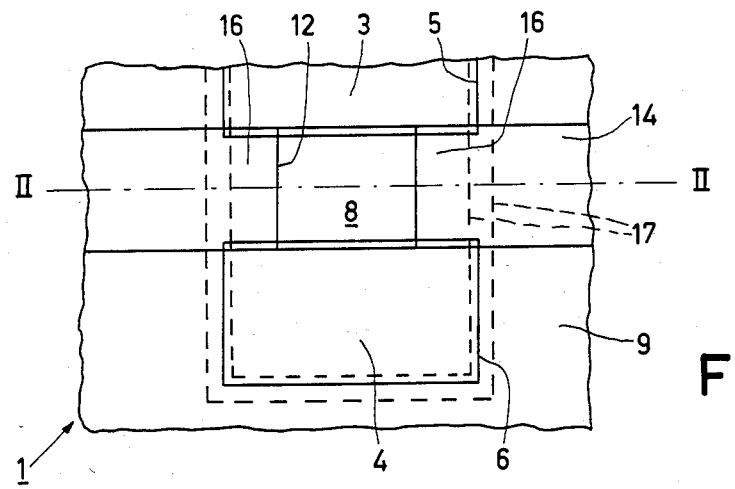
FIG. 1 shows diagrammatically a plan view of a part of a first example of a semiconductor device in accordance with the invention.
Figure 2:
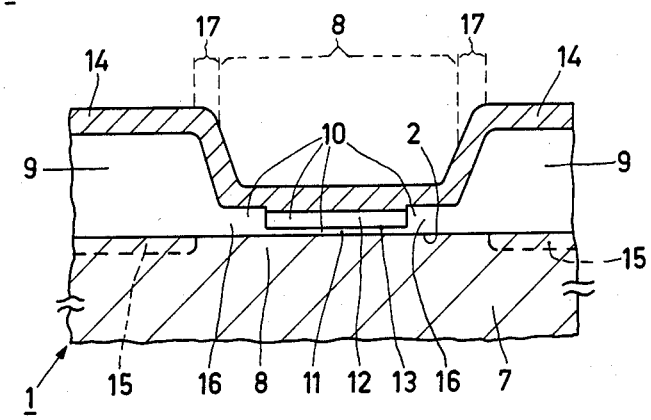
FIG. 2 shows diagrammatically a sectional view taken on the line II—II in FIG. 1 of this first example.

A first embodiment of a semiconductor device according to the invention is described with reference to FIGS. 1 and 2. This device has a semiconductor body 1 comprising at least one storage site having an insulated gate electrode, which in this example forms part of a memory field effect transistor. The semiconductor body 1 has a surface 2 to which are contiguous two electrode regions 3 and 4 which serve as source and as drain electrode, respectively, and which each form a rectifying junction 5 and 6, respectively, with a common semiconductor region 7 of a first conductivity type. Viewed on the surface 2, the electrode regions 3 and 4 are contiguous to an active semiconductor region 8 which is located between these electrode regions 3 and 4 and has a boundary which is defined for a given part by the adjoining electrode region 3, for another part by the adjoining electrode region 4 and for at least a further part by a thick insulating layer 9 serving as field insulation. On the active region 8 a thin insulating layer 10 is present, which has at least a first and a second sublayer 11 and 12, respectively, the second sublayer 12 being separated by the first sublayer 11 from the active semiconductor region 8. At and/or near the interface 13 between the first and the second sublayer 11 and 12, respectively, a boundary layer is present, in which in a usual manner charge can be stored which determines the information content of the memory transistor. A gate electrode 14 insulated from the active semiconductor region 8 extends between the electrode regions 3 and 4 and over the sublayers 11 and 12 and this gate electrode is extended to above the field insulation 9 at the boundary of the active semiconductor region 8 defined by the field insulation 9.

The semiconductor region 7 consists, for example, of n-type silicon having a resistivity of between 3 and 6Ωcm. The electrode regions 3 and 4 may consist of borondoped p-type zones. The field insulation may be constituted by a silicon oxide layer 9 having a thickness of between 1 and 1.5 μm, while in a usual manner a more highly doped p-type channel stopper zone 15 may be provided under this layer 9. Dependent upon the desired breakdown voltage of the pn junctions 5 and 6 and the doping concentration used in the channel stopper zone 15, the channel stopper zone 15 can be provided so that it directly adjoins the electrode zones 3 and 4 or so that the channel stopper zone 15 is located at a certain distance from these electrode zones 3 and 4.

The dielectric of the memory transistor consists, for example, of a thin sublayer 11 of silicon oxide having a thickness of approximately 20 Å and a second sublayer 12 of silicon nitride having a thickness of between 200 and 500 Å. The gate electrode consists of a suitable conductive material such as aluminum or polycrystalline silicon.

According to the invention, the extension of the boundary layer for charge storage located in this example at and/or near the interface 13 is limited to a region which is smaller than the active region 8. The boundary layer and the interface 13 are located at a certain distance from the boundary of the active region 8 defined by the field insulation 9. The gate electrode 14 extends between the latter boundary and the region occupied by the boundary layer over a part 16 of the thin insulating layer 10, in which no boundary layer for charge storage is present.

In this example, the boundary layer of limited extension is obtained by the use of a second sublayer 12 which in the direction of the channel width of the storage transistor does not extend over the whole active region 8, but only covers the central part of the channel region. In the direction of the channel length, the second sublayer 12 has substantially the same dimension as the gate electrode 14 so that in this direction practically the whole channel region, from the source electrode region 3 to the drain electrode region 4, is covered.

The use of a boundary layer of limited extension avoids in a simple manner the boundary layer being present in the transition region 17 in which the thin insulating layer 10 passes into the thick insulating layer 9. In the known structure of storage transistors, the second sublayer 12 is located under the whole gate electrode 14 or the sublayer 12 extends in the direction of the channel width at least from above the field insulation 9 over the active region 8 to above the field insulation 9 on the opposite side of the active region 8. Consequently, in this case, the boundary layer and the interface 13 are also present in the transition region 17, in which the thickness of the underlying insulating layer increases rapidly, but not abruptly, from a comparatively small value to the considerably larger value of the thick field insulation 9.

As is known, the exchange of charge between the boundary layer and the underlying semiconductor material and/or the overlying gate electrode is dependent not only on the value of the applied writing and erasing voltages, but inter alia also on the duration of these voltages.

It has been found that in the known structure charge is stored in the boundary layer in the long run also in the transition region 17, in which the insulating layer becomes gradually thicker, and that the quantity of charge stored in this region no longer follows entirely the writing and erasing pulses. As a result, under the transition region the threshold voltage of the memory transistor could become located at an undesired level between the high and the low threshold voltage. In order to avoid this, in the known structures, more highly doped zones are used at the semiconductor surface 2 under the transition regions, which zones have the same conductivity type as the common semiconductor region and a doping concentration which ensures that the threshold voltage under the transition regions constantly has a value such that, when a reading voltage is applied to the gate electrode, current can never flow along the transition regions between the source and the drain electrodes.

By the use of the invention, such more highly doped zones under the transition regions and the processing steps required for the provision thereof are made superfluous. The thickness of the parts 16 of the thin insulating layer 10 may generally be simply chosen so that at least at a reading voltage to be applied to the gate electrode 14, the threshold voltage at the area of the parts 16 is not exceeded so that no passage of current between the source and drain electrodes is possible under the parts 16.

As far as transition regions are formed at the junction between the parts 16 of the thin insulating layer 10 and the storage part proper of the transistor comprising the sublayers 11 and 12, the difference in thickness to be bridged is much smaller than in the transition regions 17. The transition regions between the parts 16 and the parts 11, 12 are therefore considerably narrower and moreover the small difference in thickness results in that the deviation from the high and the low threshold voltage, which could occur, is much smaller. In this connection, it is advantageous if the thickness of the parts 16 of the thin insulating layer 10 is at least a factor 10 and preferably a factor 20 or more smaller than the thickness of the field insulation 9.

It should be appreciated that the present invention is applicable to all kinds of non-volatile memory transistors, in which the stored charge is trapped. The storage effect may be obtained by the use of sublayers of different materials, such as silicon oxide and silicon nitride or silicon oxide and alumina, and/or by the provision of, for example, silicon particles between two sublayers of different materials or of the same material. Alternatively, silicon atoms or ions or other suitable atoms or ions may be provided in order to form a boundary layer for charge storage. Such atoms and/or ions may also be provided by means of, for example, ion implantation at a certain depth in an otherwise substantially homogeneous insulating layer. In this case, the first sublayer is constituted by the subjacent part of the insulating layer which separates the boundary layer for charge storage from the semiconductor surface, while the second sublayer is constituted by the part of the insulating layer which is located above the boundary layer and separates the boundary layer from the gate electrode.

The gate dielectric may also comprise more than two sublayers. Thus, in the present example, a further silicon oxide layer (not shown) may be present between the silicon nitride layer 12 and the gate electrode 14. Such an additional silicon oxide layer may be deposited, for example, from the gaseous phase or may be obtained by conversion of the upper part of the silicon nitride layer applied.

Figure 3:
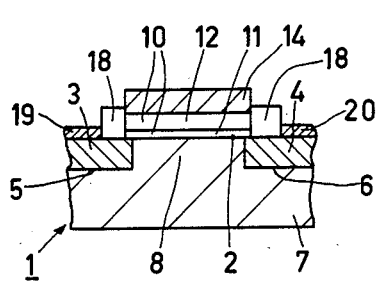
FIG. 3 shows diagrammatically a sectional view from the source electrode region to the drain electrode region of this first example.

In the present embodiment, the device has a cross-section, viewed from the source electrode region 3 to the drain electrode region 4, which is shown diagrammatically in FIG. 3. The thin insulating layer 10, the sublayers 11 and 12 and the gate electrode 14 extend from the source electrode region 3 as far as the drain electrode region 4. This FIGURE further shows that the electrode regions 3 and 4 may be provided with an insulating layer 18, in which windows for the connection of the electrode regions 3 and 4 to conductor tracks 19 and 20, respectively, may be formed. Furthermore, if desired, the whole structure may be provided with a further insulating layer (not shown), for example, for an improved passivation and protection of the memory transistor.

Figure 4:
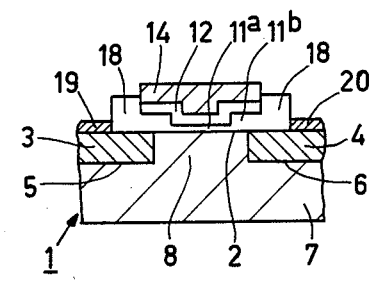
FIG. 4 shows diagrammatically a corresponding sectional view of a modification of the first example.

In a modification of the embodiment described, the first sublayer has a thinner part 11a at the area at which the storage effect proper is obtained and a thicker part 11b in the vicinity of the source region 3 and/or the drain region 4 (FIG. 4). The thickness of the thicker part 11b is chosen so that, when the reading voltage is applied to the gate electrode 14, the threshold voltage at the area of the thicker part(s) is constantly exceeded so that an inversion layer is then present under these parts. With this structure it is achieved that the storage transistor constantly acts as a transistor of the enhancement type. Moreover, this structure is favorable for obtaining a comparatively high breakdown voltage of the pn junction between the source and/or drain electrode region 3 and 4, respectively, and the common semiconductor region 7.

Figure 5:
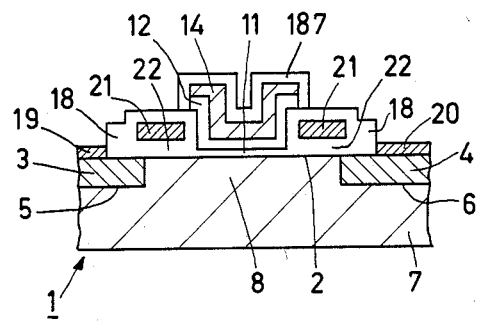
FIG. 5 and FIG. 6 show diagrammatically sectional views of other modifications of a semiconductor device also in accordance with the invention.

In another modification (FIG. 5) of the embodiment described, the memory field effect transistor has at least two and often three electrodes which are substantially parallel to each other and extend, viewed from the source electrode region 3 to the drain electrode region 4, consecutively over the active region 8. A boundary layer for charge storage is present only under the gate electrode 14, the first gate electrode. Between the gate electrode 14 and the drain electrode region 4 and/or between the source electrode region 3 and the gate electrode 14 there is provided a further, second insulated gate electrode 21, which is separated from the active semiconductor region 8 by a suitable dielectric 22, mostly of silicon oxide. The gate electrodes 14 and 21 are insulated from each other. The gate electrodes 21 may be controlled each individually, but are mostly electrically connected to each other. They may be used, for example, for selection purposes. The memory transistor may then be selected by a selection voltage at the gate electrode 21, while the gate electrode 14 has applied to it a reading voltage the value of which may be chosen independently of the selection voltage and which in a larger memory may be common to all or at least to a number of the memory transistors. The gate electrode 14 may be coated with an insulating layer 187 of, for example, silicon oxide. Such an insulating layer 187 may also be used in the other examples.

Figure 6:
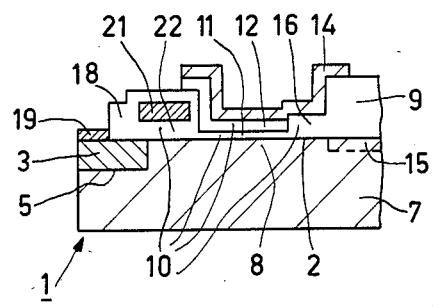

The storage site does not necessarily form part of a memory field effect transistor. In a modification, the storage site constitutes a capacitance and an insulated transfer or selection electrode 21 is present between this capacitance and an electrode region 3 above the active region 8 (FIG. 6). In this example, the active region is limited on three sides by the field insulation 9. Also on the third side opposite to the electrode region 3, the boundary layer for charge storage preferably does not extend to above the field insulation 9. The gate electrode 14 extends between the region, which is occupied by the boundary layer and is practically defined by the extension of the second sublayer, and the further part of the limitation of the active layer 8, which is defined by the field insulation 9 and which in this example also comprises the said third side, over a part 16 of the thin insulating layer 10 in which no boundary layer for charge storage is present.

In connection with the desired retention time of the information recorded, the use of a low reading voltage at the gate electrode 14 is to be preferred. If in the non-selected condition of the memory transistor and in the reading condition the voltage difference between the gate electrode 14 and the common semiconductor region 7 is practically zero or at least very small, the electric field strength in the dielectric 10 is small and the information content of the storage transistor is not likely to vary. The use of such a low reading voltage means, however, that in one condition the storage transistor will be of the enhancement type, while in the other condition it will be of the depletion type. Or in other word, the storage site can be in two conditions, the threshold voltage, at which just no conductive layer of the second conductivity type opposite to the first conductivity type is present under the gate electrode in the storage site, being positive in one condition and being negative in the other condition. This renders the memory transistor less suitable to serve at the same time as a selection transistor. Preferably, the selection transistor is always of the enhancement type so that in the absence of a selection voltage or at a voltage of zero volts at the gate electrode the selection transistor is always non-conducting.

Also when the present invention is used, it is of importance that a low reading voltage of practically zero volts can be applied. For in this case, the transition region between the parts 16 of the thin insulating layer 10 and the storage part proper will be subjected during operation of the device for a minimum period, i.e. only during the erasing or writing operation, to an electric field having a strength at which exchange of charge between the boundary layer and the common semiconductor region 7 and/or the gate electrode 14 might occur. As far as a disturbing exchange of charge could still occur in these transition regions, the disturbing effect is limited to a minimum by the use of a reading voltage of zero volts.

In connection herewith, an important preferred embodiment of the device according to the invention has at least two separate gate electrodes. A first of these gate electrodes forms part of the storage site proper and extends over the two sublayers of the thin insulating layer. The other or second gate electrode may be used for the selection of the storage site. The structure of this device may be comparable with the structure shown in FIG. 6. Another example of the embodiment will now be described with reference to FIGS. 7 to 12 inclusive.

Figure 7:
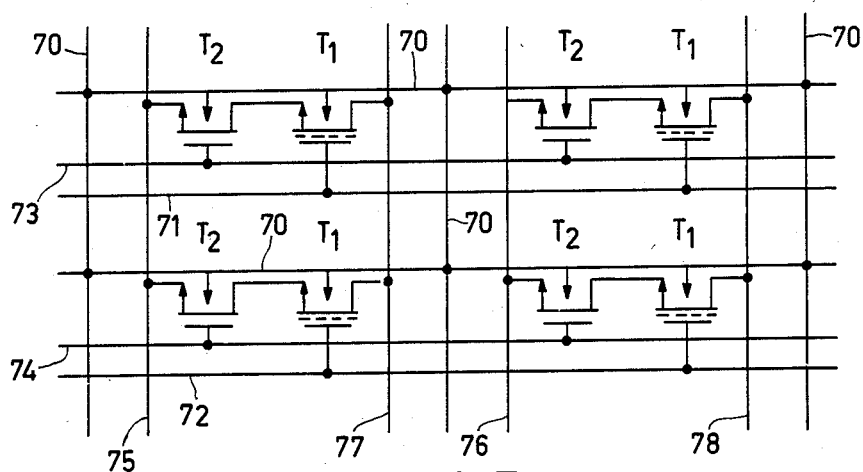
FIG. 7 shows a circuit diagram associated with a second example of a semiconductor device in accordance with the invention; of which FIG. 8 diagrammaticaly shows a part of a plan view.
Figure 8:
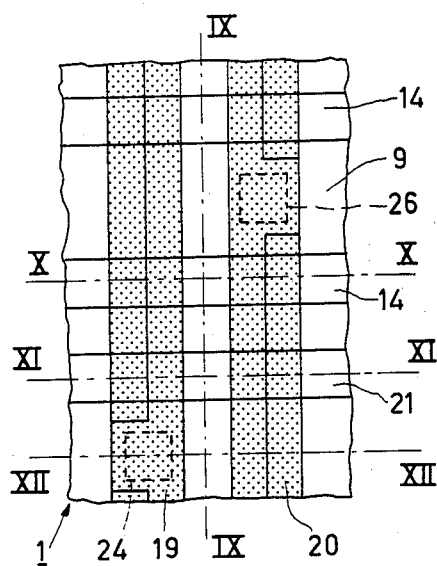
Figure 12:
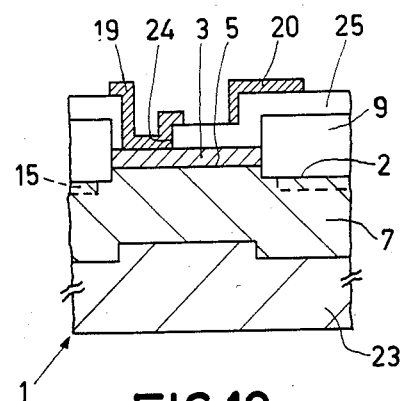
Figure 9:
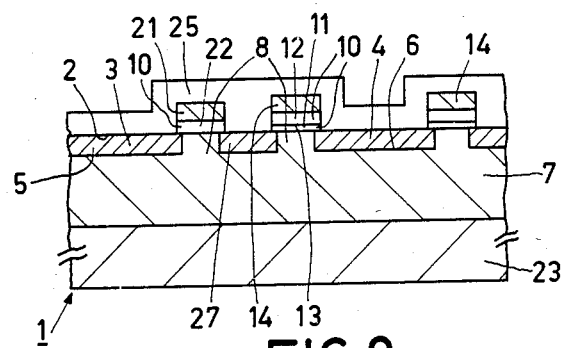
Figure 10:
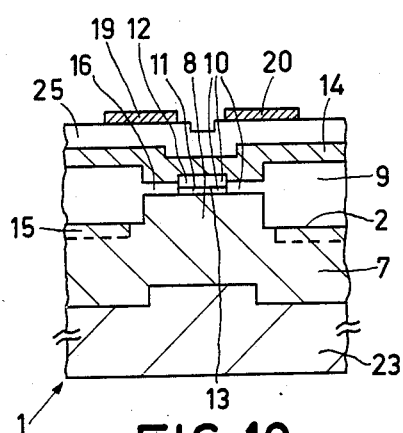
Figure 11:
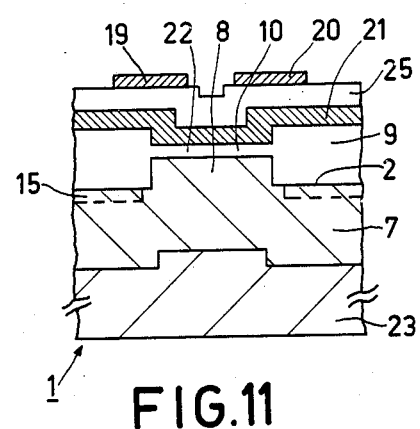

The electric circuit diagram of FIG. 7 shows a part of a memory matrix with four memory transistors $T_1$ and four selection transistors $T_2$. The transistors $T_1$ and $T_2$ have a common substrate connection 70. The gate electrodes of the memory transistors $T_1$ are connected to a writing line 71 and 72, respectively. The gate electrodes of the selection transistors $T_2$ are connected to word lines 73 and 74, respectively. The source electrodes of the selection transistors $T_2$ are connected to a first bit line 75 and 76, respectively, and the drain electrodes of the storage transistors are connected to a second bit line 77 and 78, respectively.

In the integrated circuit, all the transistors $T_1$ and $T_2$ can be provided in a common semiconductor region 7 (FIGS. 8 to 12). In this example, the common semiconductor region 7 is a p-type region, which forms part, for example, in the form of an island or a well, of a semiconductor body 1 which further comprises an n-type substrate region 23. The common semiconductor region 7 forms part of the common substrate connection 70.

The first bit lines 75 and 76 are constituted by conductor tracks 19, which are connected through windows 24 in an insulating layer 25 to source electrode regions 3 of the selection transistors $T_2$. Each electrode region 3 is common to two adjacent selection transistors of the same column of the memory matrix.

The second bit lines 77 and 78 are constituted by conductor tracks 20, which are connected through windows 26 in the insulating layer 25 to drain electrode regions 4 of the memory transistors $T_1$. The drain electrode regions 4 are also common to two adjacent memory transistors of the same column of the memory matrix.

Conductor tracks 14 and 21 extend in the row direction of the memory matrix. The conductor tracks 14 constitute the gate electrodes of the memory transistors $T_1$ and the writing lines 71 and 72. The conductor tracks 21 constitute the gate electrodes of the selection transistors $T_2$ and the word lines 73 and 74.

Active semiconductor regions 8 extend between the source electrode regions 3 and the drain electrode regions 4. Each of these active semiconductor regions 8 is bounded on two opposite sides by a source electrode region 3 and a drain electrode region 4, respectively. On the two other opposite sides, the active semiconductor region 8 is bounded by the field insulation 9. In the active semiconductor regions 8, provision is made between the gate electrodes 14 and 21 of further surface zones 27, which each constitute the drain electrode of a selection transistor $T_2$ and at the same time the source electrode of a memory transistor $T_1$.

The source and drain electrode regions 3 and 4, respectively, and the surface zones 27 are n-type regions, which are provided by doping in the common p-type semiconductor region 7.

When two separate gate electrodes 14 and 21 are used, which both extend transversely across the active semiconductor region 8 and the thin insulating layer 10, the thickness of the part 16 of the thin insulating layer, which is located under the first gate electrode 14 constituting the gate electrode of the storage site and in which no boundary layer for charge storage is present, is preferably substantially equal to the thickness of the part 22 of the thin insulating layer 10 which is located under the second gate electrode 21.

Especially when the storage site is constructed so that the reading voltage to be applied between the gate electrode 14 and the common semiconductor region 7 is substantially zero, it is advantageous to use for the parts 16 and 22 the same thickness in a manner such that the threshold voltage in the parts of the active region covered by the parts 16 and 22 has substantially the same value (different from zero) and the channel to be controlled by the second electrode 21 is of the enhancement type. The parts 16 and 22 can then be provided simultaneously during the manufacture while moreover, when a voltage of zero volts is applied to the gate electrodes 21, the storage sites are not selected and the possibility of the information content of the storage sites being disturbed is a minimum. Inter alia as a result of this, the memory matrix can be operated in a comparatively simple manner.

The operation of the semiconductor device in accordance with the invention can be explained with reference to FIG. 13. This Figure diagrammatically shows a memory matrix 70, in which the rectangle 70 indicates at the same time the common substrate connection 70 of FIG. 7 and the common semiconductor region 7 of FIGS. 8 to 12. The memory matrix 70 consequently has a common p-type region 7 which extends in an n-type substrate region 23. When the n-type substrate region 23 is connected to the most positive supply voltage $V_{DD}$, the memory matrix 70 is constantly isolated from the remaining parts of the integrated circuit during operation.

Within the memory matrix two storage cells according to FIG. 7 are indicated. Each row of the matrix constitutes a word of the memory and has a word or selection line, for example, the line 73, and a writing or control line, for example, the line 71. Each column of the matrix has a first bit line, for example, 75 or 76, and a second bit line, for example, 77 or 78.

The device 130 comprises besides the memory matrix 70 three decoders 131, 132 and 133 indicated diagrammatically by blocks. The decoder 131 is connected to the second bit lines 77 and 78. By means of this decoder 131, it is ensured that during the erasing, writing or reading operation the second bit lines are connected (or, on the contrary, are not connected and so open or floating) in the correct manner so that information supplied to the second bit lines from outside the decoder can be passed or information supplied from the matrix during reading can be recorded and/or can be passed on to the outside.

The decoder 132 is used for the word selection. Dependent upon information supplied to one or more inputs 134 about a word to be selected, for each of the words a selection voltage $V_S$ and the complement thereof $\overline{V}_S$ are produced. For a selected wor, $V_S$ is approximately equal to the most positive supply voltage $V_{DD}$ and $\overline{V}_S$ is approximately equal to the most negative supply voltage $V_{EE}$. For non-selected words, $V_S$ is approximately equal to $V_{EE}$ and $\overline{V}_S$ is approximately equal to $V_{DD}$.

The decoder 133 produces, dependent upon information supplied to one or more inputs 135 about the desired operation mode (erasing, writing, reading, stand-by condition), a control voltage $V_C$ for writing or control lines 71 of selected words, a control voltage $V_P$ for the writing or control lines 71 of non-selected words, which voltage $V_P$ is also applied to the common substrate connection 70 and so to the common p-type semiconductor region 7, and a switching voltage $V_R$. The voltage level of these three voltages $V_C$, $V_P$ and $V_R$ depends upon the operation mode chosen. To the decoder 133 can be applied three supply voltages, namely a most positive supply voltage $V_{DD}$, a voltage $V_O$ of approximately zero volt and a most negative supply voltage $V_{EE}$. In the present example, $V_{DD}$ is approximately $+5$ volt and $V_{EE}$ is approximately $-10$ to $-15$ volt.

The decoders 131, 132, 133 may be realized in different ways known per se. In the present example, the peripheral circuits are preferably constructed according to the CMOS technology. Alternatively, decoders may be used in which one or more clock signals are utilized to condition the processing of information signals and the variations of the control signals, such as $V_S$, $V_C$, $V_P$ and $V_R$, as a function of time and to adjust them with respect to each other.

Figure 13:
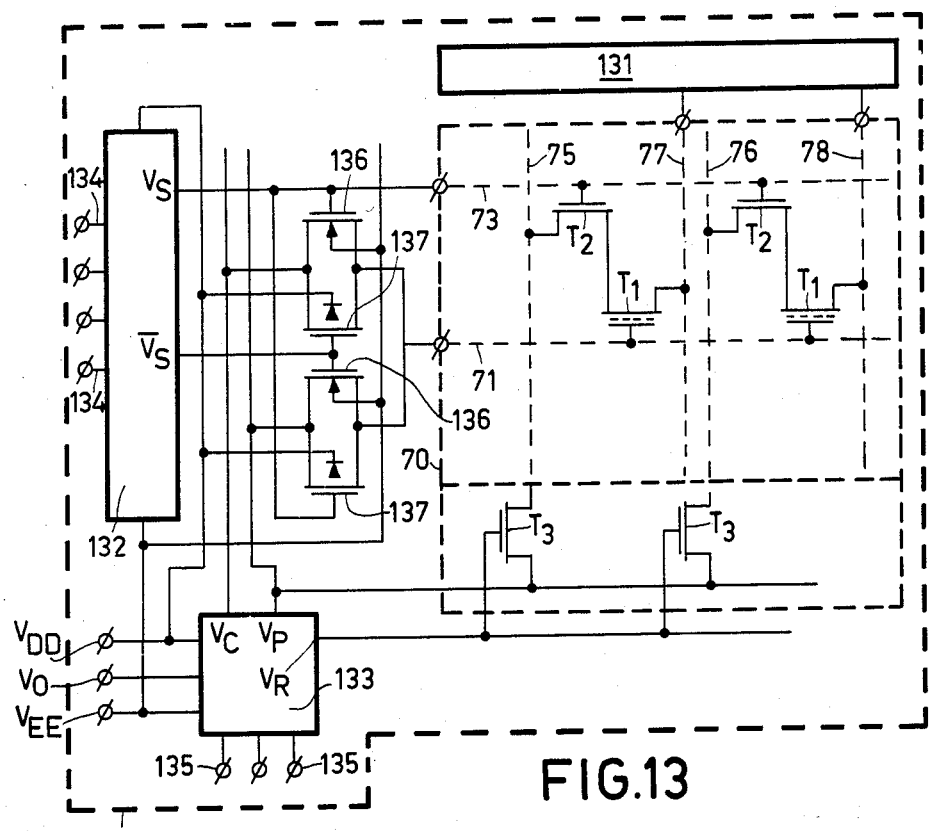
FIG. 13 shows an electrical circuit diagram for explaining the operation of the semiconductor device in accordance with the invention.

In FIG. 13, it is indicated on the lower side of the matrix 70 that the first bit lines 75, 76 are connected through commonly controlled switches $T_3$ to the common p-type semiconductor region 7 of the matrix and to the voltage $V_P$. The switches $T_3$ are constructed as n-channel MOS transistors, which are provided in the common semiconductor region 7. The switches $T_3$ are controlled by the reading common signal $V_R$, which only in the reading condition has a value of approximately $+5$ volt ($V_{DD}$) and in any other operation mode is approximately equal to $V_{EE}$.

In the reading condition, all the first bit lines 75, 76 are consequently connected to each other and reading current can flow through the first bit lines. Reading can take place by supplying through the decoder 131 current to the second bit lines 77,78 at a voltage level of, for example, approximately 5 volt. Alternatively, the second bit lines 77,78 may be precharged before the occurrence of the reading command signal $V_R$ to, for example, 5 volt, it being determinative of the information content of a selected word whether the second bit lines after the occurrence of the command signal $V_R$ are discharged to the voltage $V_P$ or retain their voltage because the storage transistor $T_1$ concerned is conducting or non-conducting.

The functions of the first and the second bit lines may also be interchanged. This means that the first bit lines 75,76 may be connected to the decoder 131 and the second bit lines 77, 78 may be connected through switches $T_3$ to the common semiconductor region 7 and to the voltage $V_P$. The latter configuration or circuit arrangement has the advantage that in the reading condition the reading voltage now supplied through the first bit lines 75, 76 is supplied only to memory transistors $T_1$ which are really selected. The capacitance connected to the first bit lines 75,76 is smaller than the capacitance connected to the second bit lines 77,78. The transistors $T_2$ are only conducting if they are selected, whereas in the memory transistors $T_1$ the information content determines independently of the selection whether these transistors $T_1$ are conducting or non-conducting. Moreover, the number of times voltage differences occur at the memory transistors $T_1$ will be smaller on the average, as a result of which the possibility of a gradual disturbance of the information content of the transistors $T_1$ is smaller.

As a result of the use of switches $T_3$, all the memory transistors $T_1$ on the side of the bit lines connected to the switches $T_3$ are not connected in each operating condition, except the reading condition. In the non-selected memory cells of a column, the memory transistors $T_1$ have no connection with this bit line because the selection transistors $T_2$ concerned are non-conducting. The memory transistor $T_1$ of the selected memory cell of this column is the only one that is connected to this bit line, but this bit line is further not connected. Thus, it is excluded that during other operating conditions than the reading condition, signals present at the bit lines connected to the decoder 131 could cross-talk through memory transistors $T_1$ which are in the conducting state to other columns. When the decoder 131 is connected to the first bit lines 75, 76, a signal present at one of these bit lines reaches only the memory transistor $T_1$ of the selected memory cell of the column concerned. When the decoder 131 is connected to the second bit lines 77,78, a signal present at one of these bit lines reaches all the memory transistors $T_1$ of the column concerned, it is true, but it does not reach memory transistors $T_1$ of other columns.

It appears therefrom that during the erasing operation, the writing operation or in the stand-by condition, so in the period in which no reading takes place, the memory transistors $T_1$ along the bit lines can be influenced at most through the bit lines connected to the decoder 131.

It should further be noted that, if the selection transistors $T_2$ are connected to the decoder 131 not directly, but, as is shown in FIG. 13, only through the memory transistors $T_1$, the word selection by the selection signal $V_S$ has no direct effect in this period. The memory transistor $T_1$ of the selected memory cell retains an open connection on the side facing the selection transistor $T_2$. In practice it makes no difference whether the selection transistor $T_2$ is conducting or non-conducting. Only in the reading condition the row or word selection takes place by means of the selection transistors $T_2$. In the erasing and writing conditions, solely the control of the lines 71 is determinative of the row or word selection.

In this circuit arrangement, the selection lines 73 may also be controlled in another manner. If for each row the signal $\overline{V}_S$ and the signal $\overline{V}_R$ are applied to a NAND gate and the output of this gate is connected to the selection line 73, the selection transistors $T_2$ are conducting only in the reading condition in the selected row. In any other operating condition all the selection transistors $T_2$ are now non-conducting, as a result of which the switches $T_3$ can be dispensed with. All first bit lines 75,76 can now be connected directly to each other and/or directly to the common semiconductor region 7 and to the voltage $V_P$.

The writing or control lines 71, which are connected to the gate electrode of the memory transistors $T_1$, have the voltage $V_C$ or the voltage $V_P$, depending upon whether the relevant row is selected or not selected. For this purpose, for each row of the matrix two transmission gates are present, which are controlled by the selection voltages $V_S$ and $\overline{V}_S$ and which pass $V_C$ to the writing or control line 71 or inhibit this voltage and inhibit $V_P$ or pass this voltage to the line 71, respectively. The transmission gates each consist in a manner known per se of an n-channel transistor 136 and a p-channel transistor 137, the main current paths of which are connected parallel to each other. Due to the control of the gate electrodes by $V_S$ and $\overline{V}_S$, respectively, the transistors of the gate are either both conducting or both non-conducting.

In the condition in which information can be erased, the decoder 133 supplies a voltage $V_C$, which is practically equal to $V_{EE}$, and a voltage $V_P$, which is practically equal to $V_{DD}$. In the selected row, the memory transistors $T_1$ are consequently in the OFF state and any charge stored in the boundary layer will flow to the common semiconductor region 7. The source and drain electrode regions of the memory transistors $T_1$ in this row will tend to assume a potential which is a junction voltage lever than $V_{DD}$, that is to say so that the pn junctions between these electrode zones and the common semiconductor region are just not current-conducting in the forward direction. Preferably, the second bit lines 77,78 are not connected during the erasing operation. When these bit lines 77,78 are connected, however, the voltage supplied is preferbly equal to $V_{DD}$ or at least less than a junction voltage lower than $V_{DD}$ in order to avoid that current will flow from the two bit lines to the common substrate connection 70.

In the non-selected rows, the gate voltage of the memory transistors $T_1$ is equal to $V_P = V_{DD}$. No potential differences occur at these memory transistors $T_1$ so that the information content is not adversely affected.

It should be noted that consequently a whole row and hence a whole word is always erased. The memory transistors $T_1$ of this row remain or become of the depletion type with a threshold voltage of, for example, approximately $-3$ volt.

In the writing condition, the decoder 133 supplies a voltage $V_C$, which is practically equal to $V_{DD}$, and a voltage $V_P$, which is practically equal to $V_{EE}$. In the selected row, information can now be written by supplying a voltage approximately equal to $V_{EE}$ to the relevant second bit lines 77 and/or 78. The threshold voltage of the memory transistor $T_1$ will consequently change from approximately $-3$ volt to, for example, $+3$ volt. The memory transistor passes from the depletion type to the enhancement type.

When, however, a voltage of, for example, approximately zero volt (approximately $V_O$) is supplied to the second bit lines 77 and/or 78, the threshold voltage of the selected memory transistor $T_1$ does not change.

In the non-selected rows, the voltage at the gate electrodes of the memory transistors $T_1$ is equal to the voltage $V_P$ of the common semiconductor region 7, $V_P$ being approximately equal to $V_{EE}$. The threshold voltage of the transistors $T_1$ in these rows will substantially not change.

In the reading condition, the decoder 133 supplies a voltage $V_C$, which is substantially equal to $V_O$, (zero volt), and a voltage $V_P$, which is substantially equal to $V_O$. The command signal $V_R$ is now approximately equal to $V_{DD}$. The threshold voltage of the switches $T_3$ and of the selection transistors $T_2$ is, for example, approximately 1.5 volt. In this condition, as explained above, the switches $T_3$ and the selected selection transistors $T_2$ are conducting and the non-selected selection transistors $T_2$ are non-conducting. The control voltage $V_C = V_P = V_O$ ensures that the conduction condition of the memory transistors $T_1$ corresponds to the information content (depletion type or enhancement type). Moreover, with this control voltage, the potential differences occurring at the memory transistors $T_1$ are as small as possible.

Also in the stand-by condition, i.e. the condition in which there is neither erased nor written nor read, the control signals $V_C$ and $V_P$ are preferably equal to each other. The preferred value for both control signals is then equal to $V_O$. The second bit lines 77 and 78 in this stand-by condition are preferably not connected or have a voltage of $V_O$ or $V_{DD}$ volt.

As is usual in non-volatile memories of the kind described herein, a supply voltage of a comparatively high value is required for erasing and writing. In the example described, the negative supply voltage $V_{EE}$ is $-10$ to $-15$ volt. Such high voltages may lead in the integrated circuit to undesired breakdown of in particular pn junctions. It is usual that this supply voltage is stabilized externally at a safe value, for example, by a Zener diode. When choosing this safe value, the tolerance in the breakdown voltage of the Zener diode to be used and the tolerances in the breakdown voltage of the pn junctions to be subjected to high voltages in the integrated circuits should be taken into account. Deviations in the breakdown voltage of these pn junctions may be caused, for example, by small variations in the manufacturing process.

In order to keep the difference between the supply voltage to be externally applied and the voltage to be used internally comparatively small, it is to be preferred to stabilize the supply voltage internally in the integrated circuit. In this manner the dissipation of the integrated circuit can be reduced.

Figures 14, 15, 16:
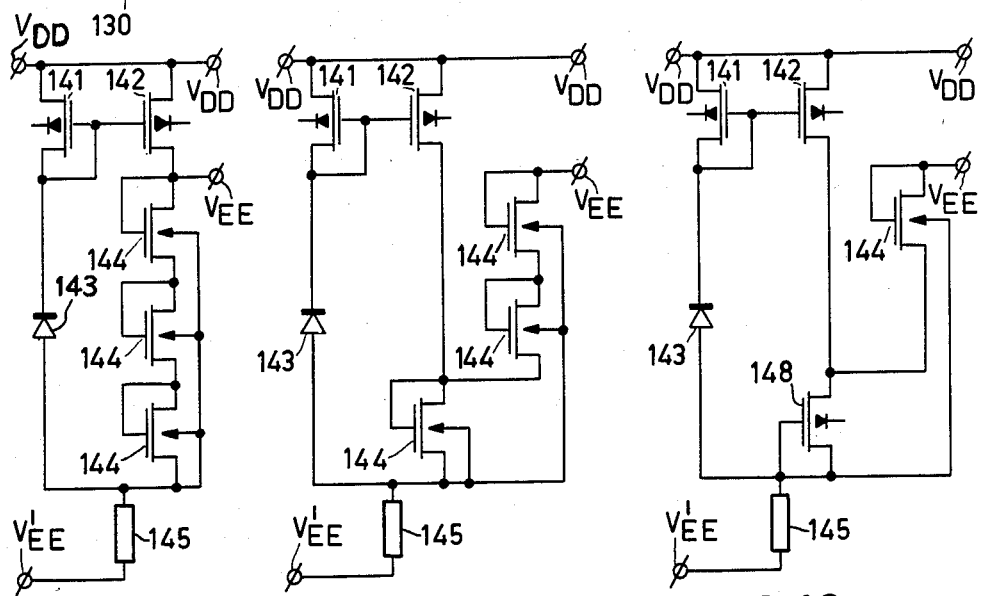
FIG. 14, FIG. 15 and FIG. 16 show electrical circuit diagrams of a supply voltage stabilization circuit which can be advantageously integrated in a semiconductor body together with the semiconductor device in accordance with the invention; while FIG. 17 and FIG. 18 diagrammatically show a part of a plan view and a sectional view, respectively, of an example of this stabilization circuit in integrated form.

Within the scope of the invention, for this stabilization use is preferably made of a circuit according to FIG. 14, 15 or 16. This stabilization circuit and the associated integrated construction may also be used advantageously in other known non-volatile memories.

The stabilization circuit shown in FIGS. 14 and 15 has a current mirror constituted by the two p-channel transistors 141 and 142, a reference diode 143, one or more p-channel transistors 144 connected as a diode and a resistor 145. The gate electrodes of the transistors 144 are connected to the relevant drain electrode. These transistors 144 connected as a diode can be simply connected in series with the p-channel transistor 142, as is shown in FIG. 14. Other connections are also possible. An example of such a connection is shown in FIG. 15. The choice of the number of transistors 144 connected as a diode determines the potential difference between the stabilized supply voltage $V_{EE}$ and the reference voltage $V_{REF}$ produced across the reference diode 143 operated in the reverse direction in the breakdown mode. With three transistors 144 the difference between $V_{REF}$ and $V_{EE}$ is in the present example approximately 4 volt.

The embodiment according to FIG. 16, which is to be preferred, has besides the current mirror constituted by the two p-channel transistors 141, 142, the reference diode 143 and the resistor 145 a p-channel transistor 148 connected as a diode and an n-channel transistor 144 connected as a diode. The use of a p-channel transistor instead of an n-channel transistor 144 in series with the p-channel transistor 142 has the advantage that the voltage at the junction between the transistors 142 and 148 is more independent of small variations in the threshold voltage which may be caused by variations in the manufacturing process.

The threshold voltage of the n-channel transistor 144 may also vary slightly due to variations in the manufacturing process, i.e. generally in a direction opposite to that of the p-channel transistors. This variation in the n-channel transistor 144 is counteracted by the voltage variation at the junction between the reference diode 143 and the resistor 145, which acts upon the channel of the n-channel transistor 144 through the p-type substrate region of this transistor. The voltage variation at the said junction is caused by the threshold voltage variation of the p-channel transistors. Compensation occurs, as a result of which also the stabilized voltage $V_{EE}$ is comparatively insensitive to variations in the threshold voltages of the p-channel and n-channel transistors.

In a practical example, the width/length ratio of the channel of the transistor 141, of the transistor 142, of the transistor 148 and of the transistor 144, respectively, was equal to 18/8, 360/8, 360/6 and 288/6, respectively. At a voltage $V_{REF}$ of 20 to 21 volt, the stabilized voltage $V_{EE}$ was 15 to 16 volt lower than the level of $V_{DD}$. Consequently, with $V_{DD}=5$ volt, $V_{EE}$ was $-10$ to $-11$ volt. The current level in the resistor 145 amounted to approximately 400 µA. The current through n-channel transistor 144 was 2 to 10 µA.

On the negative side the supply of the stabilization circuit is comparatively high-ohmic. In the present examples, this is achieved in that the external supply voltage $V'_{EE}$ is connected by means of the resistor 145, which in the integrated circuit may have the form of a p-type region which can be obtained simultaneously with the p-type region 7 of the memory matrix. On the positive side the stabilization circuit is connected to the supply voltage $V_{DD}$.

Figure 17:
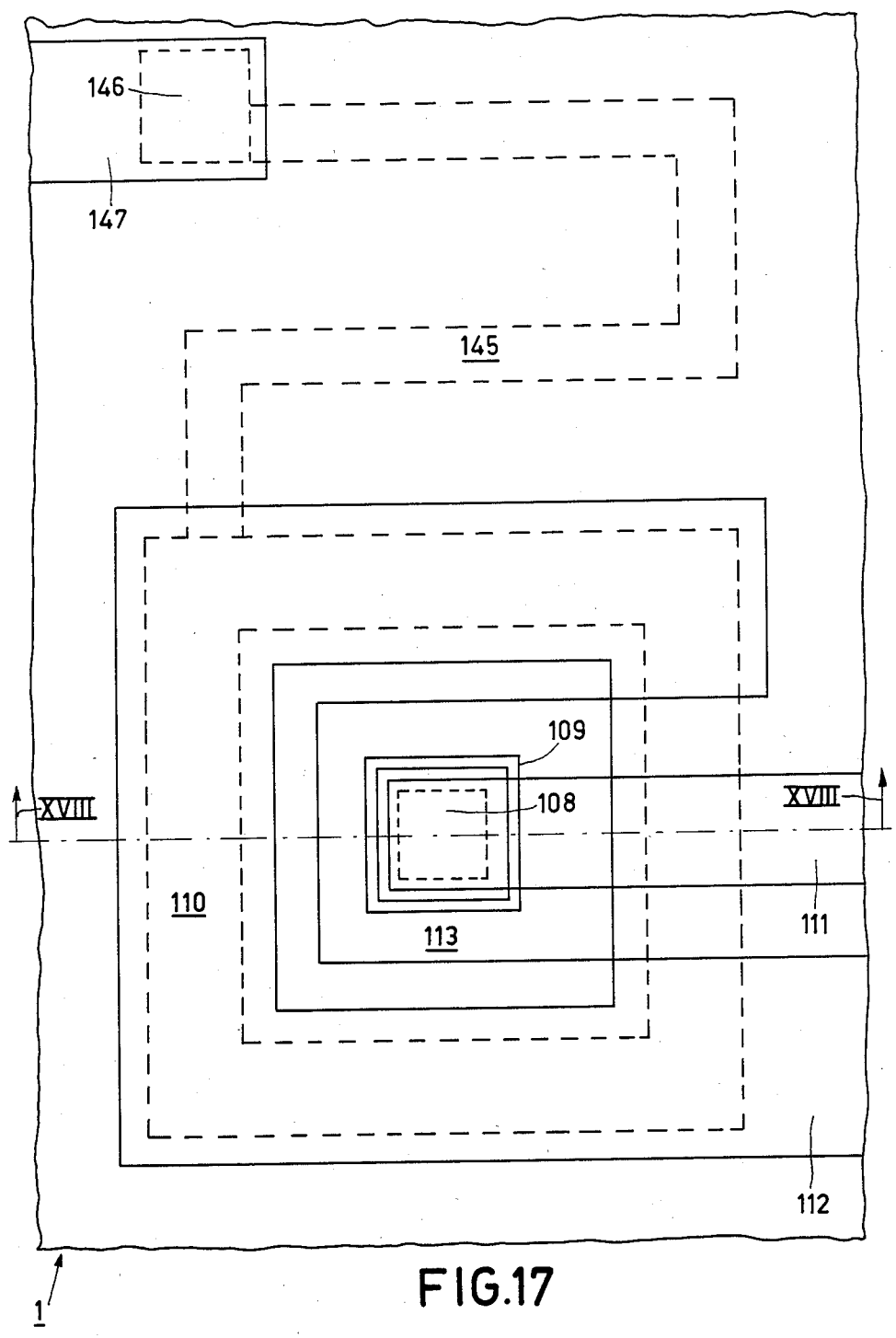
Figure 18:
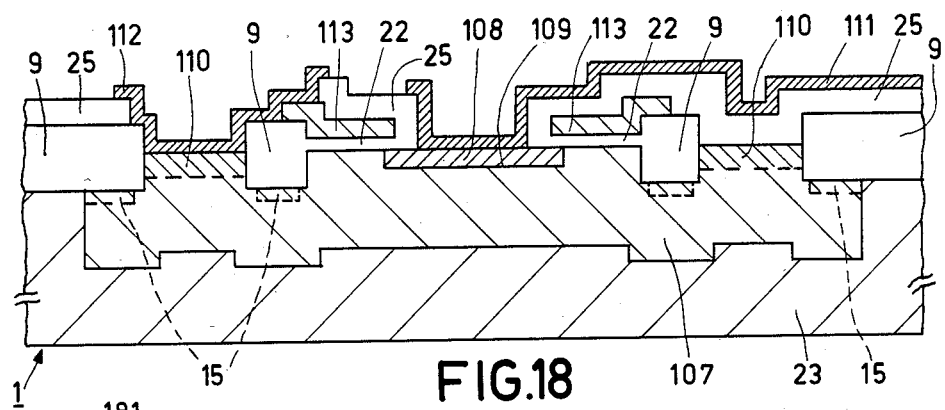

A suitable choice of the construction of the reference diode 143 is of importance for the satisfactory operation of the stabilization circuit. Within the scope of the present invention, very satisfactory results were obtained with a reference diode consisting of a p-type region, which was obtained simultaneously with the p-type region of the memory matrix, and an n-type region, which was provided in this p-type region and was obtained simultaneously with the source and drain electrode zones of the selection and memory transistors $T_1$ and $T_2$. Such a reference diode is shown diagrammatically in FIGS. 17 and 18.

The semiconductor body 1 has a p-type region 107, which is provided in the substrate region 23 simultaneously with the p-type region 7 of the memory matrix. In this region 107, an n-type diode zone 108 is provided simultaneously with the electrode zones 3,4 and 27 of the transistors $T_1$ and $T_2$. The pn junction between the region 107 and the diode zone 108 constitutes the diode junction which determines the reference voltage. Preferably, the diode zone 108 is surrounded by a contact region 110, which is annular or is at lest constructed with a closed geometry. The contact region 110 is a p-type region, which has a higher doping concentration than the adjoining part of the p-type region 107 and which can be provided simultaneously with the electrode zones of the p-channel transistors of the integrated circuit.

The diode zone 108 is connected to a connection conductor 111 and the contact region 110 is connected to a connection conductor 112. Through these connection conductors 111 and 112, which for the major part extend over the insulating layer 25, the reference diode can be connected to the p-channel transistor 141 and the p-channel transistor 148 or to the n-channel transistors 144. The n-channel transistors 144 may be provided in a usual manner in the same p-type region 107 or in a similar region. The p-channel transistors 141, 142, 148 may be provided in a usual manner in the substrate region 23.

The p-type region 107 is joined by a p-type resistance region 145, which is provided simultaneously and is located practically entirely under the field insulation 9 and has at the end a more highly doped contact region 146. The region 146 is obtained simultaneously with the region 110. The contact region 146 is connected to a conductor track 147 for connection of the external supply voltage $V'_{EE}$ to be stabilized.

The reference diode chosen is inter alia particularly suitable because the pn junction 109 largely resembles the pn junctions in the integrated circuit across which during operation the largest voltage differences occur and which therefore have to be protected from breakdown. When the negative supply is stabilized on a few diode voltages (the diodes 144) below the breakdown voltage of the reference diode and so below the breakdown voltage of the pn junctions to be protected, a higher reliability in operation in combination with a comparatively small loss of voltage space available is obtained.

In a preferred embodiment, the diode zone 108 of the reference diode is contiguous to a part of the p-type region 107 which is covered with a comparatively thin insulating layer, in which event a conductive layer 113 connected to the conductive layer 112 extends over this insulating layer. The thickness of the insulating layer located under the conductive layer 113 preferably corresponds to the thickness of the dielectric layer 22 under the gate electrode 21 of the selection transistors $T_2$. Therefore, the insulating layer is also designated by 22 in FIG. 18.

In this embodiment, the reference diode shows an even greater resemblance to the pn junctions to be protected. The condition in which breakdown of the pn junctions of the electrode zones of the transistors $T_1$ and $T_2$ is most likely to occur, would be the condition in which the p-type region 7 and the relevant gate electrodes 14 and/or 21 are connected to $V_{EE}$ and the relevant electrode zone is connected to $V_{DD}$. This condition could occur, for example, at the drain electrode zones of non-selected memory transistors $T_1$ in a column in which during writing a signal $V_{DD}$ is supplied to the second bit line instead of the above-mentioned signal of approximately zero volt. This condition may also occur in transistors in the peripheral circuits, for example, in the decoder 132 and in the transmission gates which are connected to the decoder 133 and the writing or control lines 71,72.

Like the contact region 110, the conductive layer 113 and the underlying thin insulating layer 22 are preferably annular or have at least a closed geometry so that they surround the diode zone 108 at the surface of the semiconductor body.

The embodiments described can be manufactured entirely by means of processes known in semiconductor technology, such as oxidation treatments, implantation and/or diffusion treatments, photolacquer and etching techniques and deposition methods. By way of example, an advantageous method of manufacturing the semiconductor device according to FIGS. 8 to 12 inclusive will be described more fully.

Figure 19:
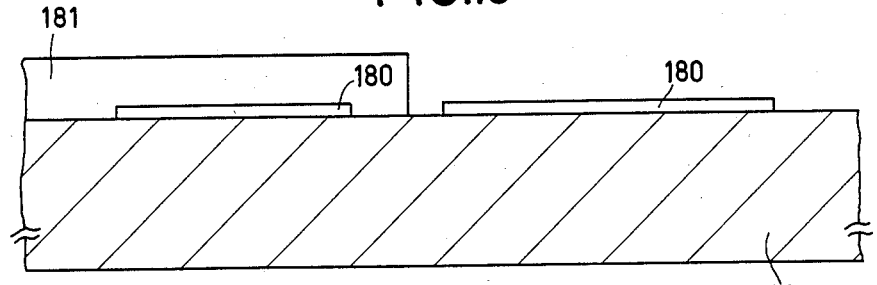
FIG. 19 to FIG. 25 inclusive show a semiconductor device in different stages during the manufacture using an embodiment of a method in accordance with the invention.

As the substrate region 23, an n-type silicon body with $<100>$-orientation and a resistivity of 3 to 6 Ω .cm can be used. In a usual manner, a patterned oxidation mask 180 (FIG. 19) can be provided thereon. The oxidation mask consists, for example, of a thin layer of approximately 500 Å silicon oxide and a silicon nitride layer having a thickness of approximately 1300 Å applied thereto by means of, for example, LPCVD. A surface layer of the silicon nitride may be converted, if desired, into silicon oxide.

Subsequently, a photolacquer layer pattern 181 can be applied. The doping of the p-type regions 7,15 may be provided by implantation. For example, $B^+{}_{11}$ ions with a dose of approximately $1.10^{13}$ cm$^{-2}$ and an implantation energy of approximately 120 keV and $BF^+{}_2$ ions with a dose of approximately $5.10^{13}$ cm$^{-2}$ and an energy of 120 keV are utilized. The $B^+{}_{11}$ ions are arrested only by the photolacquer layer pattern 181. The $BF^+{}_2$ ions are additionally arrested by the oxidation mask 180.

By means of a second photolacquer layer pattern 182 (FIG. 20), $As^+$ ions can then be implanted outside the circuit elements to be provided at the surface directly in the n-type part 23 in order to obtain more highly doped n-type channel stopper zones $23^a$. A suitable dose is, for example, approximately $2.10^{12}$ cm$^{-2}$ and the implantation energy may be 150 keV. Also for this implantation, both the photolacquer layer pattern 182 and the exposed parts of the oxidation mask 180 form a complete masking.

Figure 20:
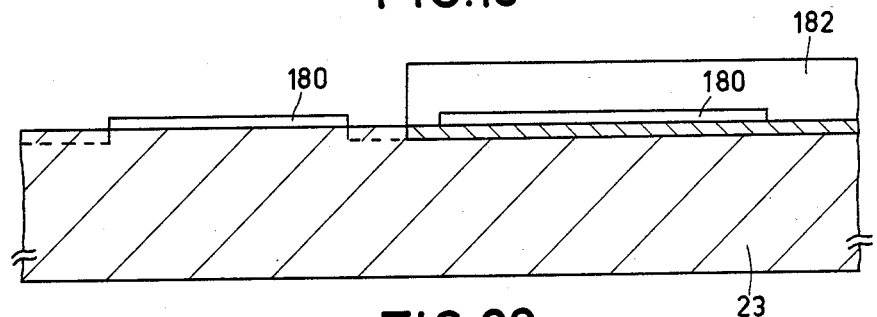

By an oxidation treatment in a wet oxidizing atmosphere at approximately 1150° C. and removal of the oxidation mask 180, the structure of FIG. 20 can be obtained. The depth of the p-type region 7 is, for example, approximately 5 μm and the thickness of the silicon oxide layer 9 is, for example, approximately 1.3 μm. The silicon oxide layer 9 has a pattern which corresponds to the pattern of the field insulation of the semiconductor device to be manufactured. This pattern leaves free the parts of the surface of the semiconductor body destined for providing circuit elements.

Figure 21:
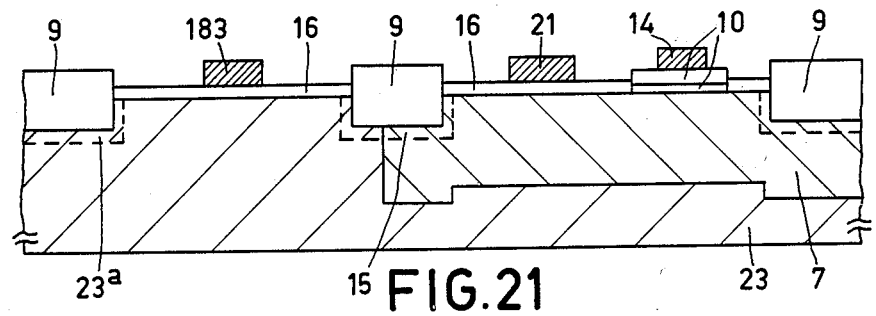
Figure 22:
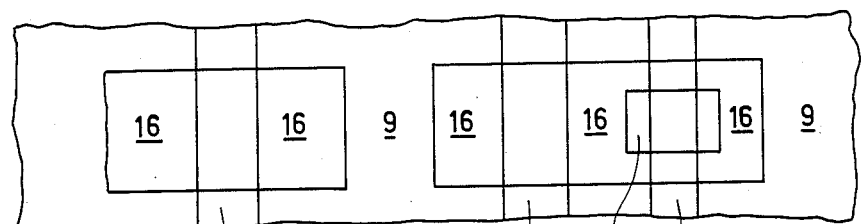

Subsequently, a layer of silicon oxide of approximately 20 Å is applied, for example, by means of plasma oxidation. This silicon oxide layer is covered by means of LPCVD with silicon nitride up to a thickness of approximately 300 Å. The dielectric for the memory transistors is formed from this double layer. By means of a plasma etching treatment with the use of a photolacquer layer pattern, only the desired part 10 (FIGS. 21 and 22) of this double layer is left on the semiconductor body as a first thin insulating layer. The dielectric 10 lies directly on the semiconductor surface and has at least two opposite edges along which it extends at a certain distance from the thick-insulating layer 9. In this example, the first thin insulating layer 10 is surrounded at this stage along its whole periphery by the field insulation 9 so that this insulating layer 10 lies entirely free from this field oxide 9.

After the pattern of the dielectric 10 has been obtained, a heat treatment at approximately 1000° C. is carried out in a dry oxidizing atmosphere, by means of which an oxide layer 16 having a thickness of approximately 650 Å is obtained. This oxide layer 16 forms a second thin insulating layer, which covers at least the remaining part of the parts of the surface destined for providing circuit elements which is not covered by the first insulating layer. The thickness of the insulating layer 16, which ultimately lies under the second gate electrode 21 and also under a part of the first gate electrode 14, is preferably larger than the thickness of the first thin insulating layer 10, which comprises the first and the second sublayer 11 and 12 and the boundary layer for charge storage. Subsequently, the gate electrodes 14, 21 and 183 formed from polycrystalline silicon can be provided in a usual manner. These gate electrodes have a thickness of, for example, approximately 4000 Å, are doped, for example, with phosphorus and have a sheet resistance of, for example, approximately 30 Ω. The gate electrode 14 of the storage site covers the first and the second thin insulating layer 10 and 16, respectively, as well as the thick insulating layer 9 in part.

Figure 23:
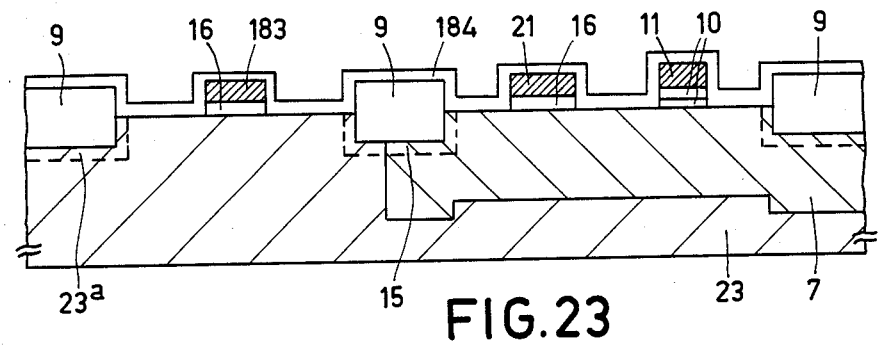

The gate electrodes 14, 21 and 183 can be used as a mask in order to remove the superfluous parts of the insulating layer 16 by etching (FIG. 23). Then an etching treatment, preferably a plasma etching treatment, is carried out, by means of which the part of the dielectric 10 not covered by the gate electrode 14 is removed.

The first thin insulating layer 10 is consequently etched twice: once before the gate electrodes are provided so that the insulating layer 10 is located at least along two opposite edges extending transversely to the direction of the gate electrodes at a certain distance from the thick insulating layer 9 and a second time after the gate electrodes have been provided. After this second etching treatment at the latest, the first thin insulating layer 10 will be located along its whole periphery at a certain distance from the thick insulating layer 9.

Although this is not necessary, the structure obtained is preferably covered with a layer of silicon nitride 184 having a thickness of approximately 400 Å. An implantation of $BF^+{}_2$ ions can then be carried out at 150 keV with a dose of approximately $8.10^{14}$ cm$^{-2}$. This treatment serves to obtain p-type zones 185, such as the electrode zones of p-channel transistors, and the zones 110 and 146 of the integrated voltage stabilization circuit according to FIGS. 17 and 18. This doping treatment can be carried out without using a mask.

Figure 24:
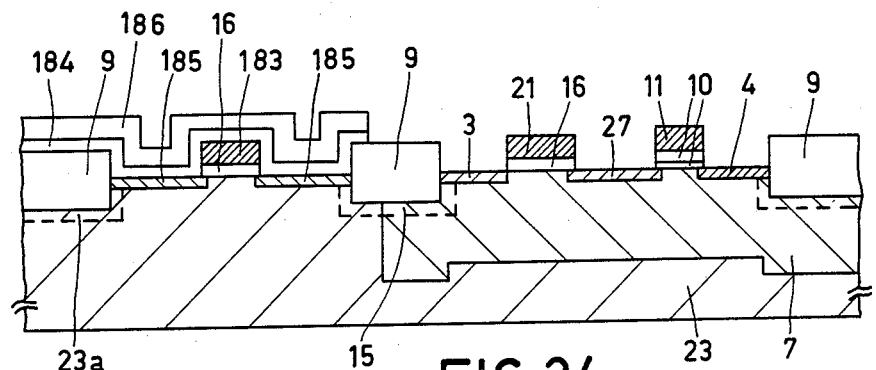
Figure 25:
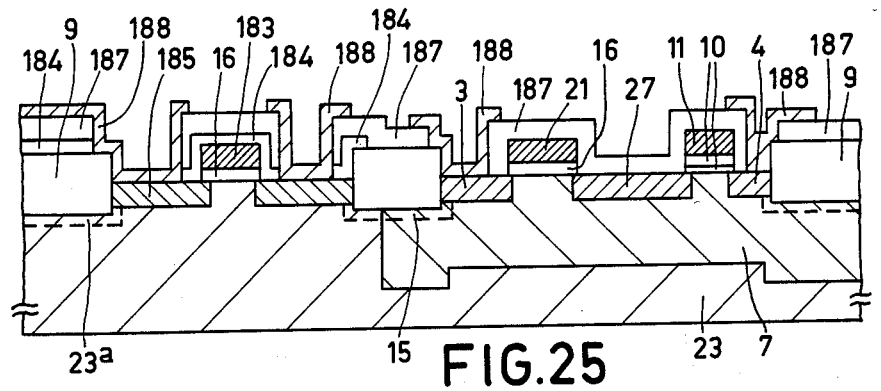

With the aid of a photolacquer layer pattern 186 (FIG. 24), dopant is locally implanted for the electrode zones 3, 27, 4 of n-channel transistors, such as the selection and memory transistors. For example, phosphorus ions are used with an energy of approximately 80 keV. The dose may amount to approximately $3.5.10^{15}$ cm$^{-2}$. After this implantation treatment, with the use of the same pattern 186 as a mask, the exposed parts of the nitride layer 184 can be removed. After removal of the photolacquer layer pattern 186, for example, a layer of silicon oxide 187 (FIG. 25) is deposited from the vapor phase. The thickness of this layer 187 may be approximately 6000 Å. The oxide layer 187 is preferably doped with phosphorus in known manner. This doping may be provided during the deposition of the layer or thereafter. Preferably, however, after the deposition, contact windows are first etched in the oxide layer 187 in a usual manner, whereupon a heat treatment at approximately 1000° C. in a phosphorus-containing atmosphere is carried out. Only after this treatment, the parts of the nitride layer 184, which are present in the contact windows located above the p-type zones 185, are etched away. Inter alia the advantage is then obtained that during the last-mentioned heat treatment, no phosphorus doping can penetrate into the p-type zones 185.

The ultimate penetration depth of the p-type zones 185 is, for example, 0.5 μm. The n-type zones 3, 4 and 27 may have a depth of approximately 1 μm.

After the contact windows have been fully opened and cleaned, a pattern of conductive connections 188 of, for example, aluminum or another suitable conductive material may be applied in a usual manner. These conductive connections 188 are in direct contact with p- type zones 185, with n-type zones and at areas not shown with conductor tracks and/or gate electrodes 183,21,11 formed from polycrystalline silicon.

It should be appreciated that the invention is not limited to the embodiments described, but that for those skilled in the art many modifications are possible within the scope of the invention. For example, instead of silicon as semiconductor material use may also be made of, for example, germanium or an $A_{III}$-$B_V$ compound. Silicon nitride or aluminum oxide may be used as an insulating layer. The insulating layer serving as field insulation may be obtained by means of other conventional methods than local oxidation. The polysilicon tracks may be provided with a suitable metal silicide or may be replaced fully or in part by a suitable metal, such as molybdenum, or a suitable metal silicide.

The conductivity types are given only by way of example and may be interchanged, in which event the indicated voltages may be adapted in a corresponding manner. Furthermore, the storage sites in accordance with the invention may be combined in a memory matrix in other ways known per se and a memory matrix may be utilized and controlled in another manner than that described. The non-volatile memory transistor may also be utilized for other applications than memory matrices.

What is claimed is:

1. A semiconductor device comprising a semiconductor body having at least a storage site with an insulated gate electrode, the semiconductor body having a surface contiguous to at least an electrode region which serves as an electrode and forms a rectifying junction with a semiconductor region of a first conductivity type common to the electrode region and the storage site, the electrode region, viewed on the surface, being contiguous to an active semiconductor region which has a boundary which is defined for a first part by the adjoining electrode region and for at least a further part by a thick insulating layer serving as field insulation, a thin insulating layer being present on the active region, said thin insulating layer comprising at least a first and a second sublayer, the second sublayer being separated by the first sublayer from the active region, and a boundary layer being present adjacent the interface between the first and the second sublayer, in which boundary layer charge can be stored which determines the information content of the storage site, a gate electrode isolated from the active region extending over the sublayers, which gate electrode extends at the further part of the boundary of the active region defined by the field insulation to above the field insulation, characterized in that the boundary layer for charge storage has an extension beneath said gate electrode in a direction toward said further part of said boundary which is limited to a region which is smaller than the active region and is located at a distance from the further part of the boundary of the active region defined by the field insulation, the gate electrode extending between this further part of the boundary and the region occupied by the boundary layer over a part of the thin insulating layer in which no boundary layer for charge storage is present.

2. A semiconductor device as claimed in claim 1, characterized in that the storage site forms part of a memory transistor comprising at least a source electrode region and a drain electrode region, the active semiconductor region being located between said source and drain electrode regions, and the thin insulating layer, which comprises the first and the second sublayer, comprises a gate dielectric for the memory transistor.

3. A semiconductor device as claimed in claim 1 or 2, characterized in that the storage site, dependent upon the information condition, can be in two different conditions, the threshold voltage being positive in one condition and negative in the other condition, said threshold voltage being the voltage at which a conducting layer of a second conductivity type opposite to the first conductivity type under the gate electrode in the storage site is just extinguished.

4. A semiconductor device as claimed in claim 1 or 2, characterized in that the threshold voltage at the area of the part of the thin insulating layer, which is located under the gate electrode and in which no boundary layer for charge storage is present, has a value at which an inversion layer of a second conductivity type opposite to the first conductivity type can be produced at this area only by means of a voltage to be applied to the gate electrode.

5. A semiconductor device as claimed in claim 1 or 2, characterized in that the part of the thin insulating layer which is located under the gate electrode and in which no boundary layer for charge storage is present, has a thickness with which the threshold voltage in situ is larger than the voltage to be applied between the gate electrode and the electrode region of the storage site for reading the information content.

6. A semiconductor device as claimed in claim 1 or 2, characterized in that the thickness of the part of the thin insulating layer which is located under the gate electrode and in which no boundary layer for charge storage is present, is at least a factor 10 smaller than the thickness of the adjoining part of the thick insulating layer serving as field insulation.

7. A semiconductor device as claimed in claim 1 or 2, characterized in that the thickness of the part of the thin insulating layer, which is located under the gate electrode and in which no boundary layer for charge storage is present, is larger than the thickness of the part of the thin insulating layer which comprises the first and the second sublayer and the boundary layer for charge storage.

8. A semiconductor device as claimed in claim 1 or 2, characterized in that the said insulated gate electrode comprises a first gate electrode, at least a second insulated gate electrode extending above the active semiconductor region and over the thin insulating layer, no boundary layer for charge storage being present in the thin insulating layer under the second gate electrode, the second gate electrode, viewed on the surface, being located between the first gate electrode and the electrode region and the thickness of the thin insulating layer under the second gate electrode being substantially equal to the thickness of the part of the thin insulating layer, which is located under the first gate electrode and in which no boundary layer for charge storage is present.

* * * * *